United States Patent
Momtaz et al.

(10) Patent No.: US 10,014,846 B2
(45) Date of Patent: Jul. 3, 2018

(54) INCREASING OUTPUT AMPLITUDE OF A VOLTAGE-MODE DRIVER IN A LOW SUPPLY VOLTAGE TECHNOLOGY

(71) Applicant: BROADCOM CORPORATION, Irvine, CA (US)

(72) Inventors: Afshin Momtaz, Laguna Hills, CA (US); Adesh Garg, Aliso Viejo, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/336,979

(22) Filed: Jul. 21, 2014

(65) Prior Publication Data

US 2015/0381150 A1    Dec. 31, 2015

Related U.S. Application Data

(60) Provisional application No. 62/017,176, filed on Jun. 25, 2014.

(51) Int. Cl.
*H03K 3/00* (2006.01)
*H03K 3/012* (2006.01)
(Continued)

(52) U.S. Cl.
CPC ..... *H03K 3/012* (2013.01); *H03K 19/017545* (2013.01); *H04L 25/028* (2013.01); *H04L 25/0278* (2013.01); *H04L 25/0282* (2013.01)

(58) Field of Classification Search
None
See application file for complete search history.

(56) References Cited

U.S. PATENT DOCUMENTS 5,629,641 A * 5/1997 Cheng ................ H04L 25/0274
   327/108
5,959,490 A * 9/1999 Candage .......... H03K 19/01852
   326/81

(Continued)

FOREIGN PATENT DOCUMENTS

CN    103294095 A    9/2013
WO   WO-2013/089773 A1    6/2013

OTHER PUBLICATIONS

Song et al., "A 6-Gbit/s Hybrid Voltage-Mode Transmitter With Current-Mode Equalization in 90-nm CMOS," IEEE Transactions on Circuits and Systems II: Express Briefs, Aug. 2012, vol. 59, No. 8, pp. 491-495.

(Continued)

*Primary Examiner* — Lincoln Donovan
*Assistant Examiner* — Khareem E Almo
(74) *Attorney, Agent, or Firm* — McDermott Will & Emery LLP

(57) ABSTRACT

An apparatus for driving a load using a low supply voltage includes a voltage-mode driver and a current source arrangement. The voltage-mode driver provides a desired termination impedance and a first portion of a desired output current to the load. The current source arrangement provides a second portion of the desired output current. The desired output current generates a predetermined voltage swing across the load, while the voltage-mode driver and the current source arrangement are powered by the low supply voltage.

20 Claims, 5 Drawing Sheets

(51) Int. Cl.
*H03K 19/0175* (2006.01)
*H04L 25/02* (2006.01)

(56) References Cited

U.S. PATENT DOCUMENTS

| | | | | |
|---|---|---|---|---|
| 6,121,800 | A * | 9/2000 | Leighton | G11B 5/02 327/110 |
| 6,252,450 | B1 * | 6/2001 | Patti | G11B 5/012 327/110 |
| 6,686,772 | B2 | 2/2004 | Li et al. | |
| 6,704,818 | B1 | 3/2004 | Martin et al. | |
| 6,856,178 | B1 * | 2/2005 | Narayan | H03K 19/01858 326/87 |
| 7,224,135 | B1 * | 5/2007 | Menegoli | G11B 19/28 318/294 |
| 7,315,186 | B2 * | 1/2008 | Martin | H04L 25/03878 326/27 |
| 8,396,106 | B2 * | 3/2013 | Connolly | H04B 3/04 370/235 |
| 8,487,654 | B1 * | 7/2013 | Chen | H02M 7/48 326/82 |
| 8,520,348 | B2 * | 8/2013 | Dong | G06F 13/4086 326/30 |
| 2005/0030121 | A1 * | 2/2005 | Gilbert | H03G 1/0035 333/81 R |
| 2006/0226907 | A1 * | 10/2006 | Gilbert | H03F 3/45 330/254 |
| 2007/0002954 | A1 | 1/2007 | Cornelius et al. | |
| 2009/0168854 | A1 | 7/2009 | Liang et al. | |
| 2009/0203333 | A1 * | 8/2009 | Jeffries | H04L 25/0276 455/91 |
| 2013/0195165 | A1 * | 8/2013 | Poulton | H04B 1/04 375/229 |
| 2014/0055163 | A1 * | 2/2014 | Song | H04L 25/0276 326/63 |
| 2015/0022243 | A1 * | 1/2015 | Wu | H03K 17/16 327/108 |

OTHER PUBLICATIONS

Loke et al., "An 8.0-Gb/s HyperTransport Transceiver for 32-nm SOI-CMOS Server Processors," IEEE Journal of Solid-State Circuits, Nov. 2012, vol. 47, No. 11, pp. 2627-2642.

* cited by examiner

INCREASING OUTPUT AMPLITUDE OF A VOLTAGE-MODE DRIVER IN A LOW SUPPLY VOLTAGE TECHNOLOGY

CROSS-REFERENCE TO RELATED APPLICATIONS

This application claims the benefit of priority under 35 U.S.C. § 119 from U.S. Provisional Patent Application No. 62/017,176 filed Jun. 25, 2014, which is incorporated herein by reference in its entirety.

TECHNICAL FIELD

The present description relates generally to line drivers, and more particularly, but not exclusively, to methods and apparatus for increasing output amplitude of a voltage-mode driver in a low supply-voltage technology.

BACKGROUND

Line drivers including voltage-mode drivers are used in a number of applications such as mobile serializer-deserializer (SerDes) circuits, network switches and data center applications, and high speed PHY circuits. The main function of a line driver is to transmit a signal reliably across a medium (e.g., a line such as a conductor), in the presence of attenuation and distortion.

The required transmitted output swing specified by current standards (e.g., the IEEE standards) is technology independent. With technology nodes moving to smaller feature sizes, however, nominal supply voltage is also scaled down. For example, the 802.3ap standard for backplane Ethernet interface (e.g., IEEE KR) requires a minimum differential peak-to-peak voltage of 800 mV, which is greater than a nominal supply voltage that technologies below 28 nm can support. In a 16 nm technology, for instance, the supply voltage is approximately 800 mV. Some of the existing solutions increase the driver power supply and use a level shifter from the voltage-driver core to the power supply, which increases power consumption, or use two power supplies or a low drop-out (LDO) circuit. Other solutions use lower on-chip resistors, which sacrifices an important transmitter specification such as a return loss.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and can be practiced using one or more implementations. In one or more instances, well-known structures and components are shown in block diagram form in order to avoid obscuring the concepts of the subject technology.

The subject technology provides methods and implementations for increasing output amplitude of a voltage-mode driver in a low supply-voltage technology. The disclosed technology merges a voltage-mode driver with a current driver (e.g., an H-driver) to provide a minimum differential peak-to-peak voltage across the load, as required by the current standards. The subject technology includes a number of advantageous features, for example, reduced power consumption and chip area without sacrificing the return loss, as compared to existing solutions that, for instance, rely on voltage mode drivers with increased power supply or decreased on-chip resistors or other solutions based on H-drivers or current-mode logic (CML) drivers. Further, the disclosed solution is the lowest power solution that is compliant with current standards (e.g., IEEE standards) and future process technologies.

Figure 1:
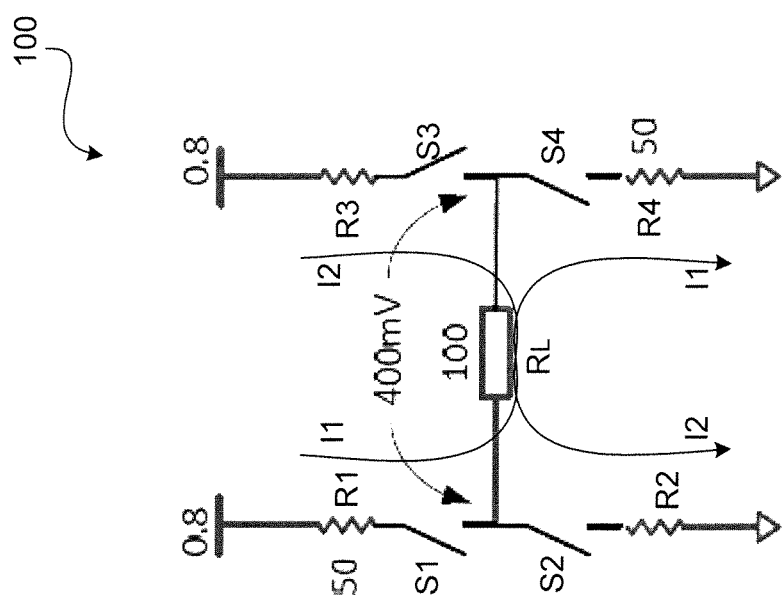
FIG. 1 illustrates an example of a voltage-mode driver circuit.

FIG. 1 illustrates an example of a voltage-mode driver circuit 100 for driving a load impedance. The voltage-mode driver circuit 100 includes resistors R1-R4 and switches S1-S4 and is used to drive the load resistor $R_L$, which can be an input impedance of a device such as a serializer/deserializer (SerDes). The voltage-mode driver circuit 100 is implemented in a technology node (e.g., 16 nm) that allows a limited supply voltage (e.g., VDD=0.8V). On the other hand, the current standard (e.g., an IEEE standard, such as IEEE KR) requires a nominal voltage swing (e.g., differential peak-to-peak voltage) of ~1V across the load impedance such as a resistor $R_L$ (e.g., 100Ω), and the voltage-mode driver circuit 100 has to provide an impedance match to the load resistor $R_L$. The voltage-mode driver circuit 100 operates by providing current I1 to the load resistor $R_L$, through termination resistors R1 and R4, in a positive bit of data when switches S1 and S4 are closed and switches S2 and S3 are open, and providing current I2 to the load resistor $R_L$, through termination resistors R3 and R2, in a negative bit of the data when switches S3 and S2 are closed and switches S1 and S4 are open.

With an example value of 100Ω for the load resistor $R_L$, each of the termination resistors R1-R4 has to be ~50Ω. It is understood that for this example, with VDD=0.8V, the value of currents I1 and I2 cannot exceed ~4 mA. In other words, the voltage swing (e.g., differential peak-to-peak amplitude) across the 100Ω load resistor $R_L$ cannot exceed ~800 mV, which is less than the nominal value of 1V required by the standard. Existing solutions for mitigating this problem face a number of drawbacks including increased power consumption and chip area and may sacrifice an important specification such as return loss. The subject technology, as disclosed herein, solves this problem without the above-mentions drawbacks.

FIGS. 2A through 2E illustrate examples of an apparatus for driving a load using a low supply voltage in accordance with one or more implementations of the subject technology. An apparatus 200A of FIG. 2A, for example, includes a first circuit 210 and a second circuit 220. The first circuit 210 can be a voltage-mode driver circuit such as the voltage-mode driver circuit 100 of FIG. 1. The second circuit 220 includes a current source arrangement. The first circuit 210 can provide the desired termination impedance and a first portion of a desired output current to the load resistor (e.g., $R_L$ of FIG. 1). The first circuit 210 and the second circuit 220 are powered by a low supply voltage $V_{DD}$ (e.g., 0.8 V) that is a nominal supply voltage associated with an employed technology node (e.g., 16 nm). With this nominal supply voltage, the first circuit 210 would be incapable of independently providing a minimum current (e.g., 10 mA) to the resistor $R_L$ (e.g., 100Ω) of FIG. 1 that can establish the nominal voltage swing (e.g., 1V) across the load resistor $R_L$, particularly in the presence of variations, for example, of the resistance values.

The current source arrangement 220 provides a second portion of the desired output current that can generate the predetermined voltage swing (e.g., the nominal voltage of 1V) across the 100Ω load resistor $R_L$ of FIG. 1. In one or more implementations, the current source arrangement 220 includes current sources I1-I4 and switches S1-S4 that are configurable to provide the second portion (e.g., 2 mA) of the desired output current (e.g., 5 mA) flowing in two opposing directions indicated by the curved arrows D1 and D2 into the load (not shown for simplicity). For example, in a positive bit of data when switches S1 and S4 are closed and switches S2 and S3 are open, current sources I1 and I4 (e.g., identical current sources) are active and are responsible for providing the second portion of the desired output current. In a negative bit of the data when switches S3 and S2 are closed and switches S1 and S4 are open, current sources I3 and I2 (e.g., identical current sources) are active and provide the second portion of the desired output current. In one or more aspects, the switches S1-S4 are configurable to dynamically control an amount of current provided to the load.

Figure 2A:
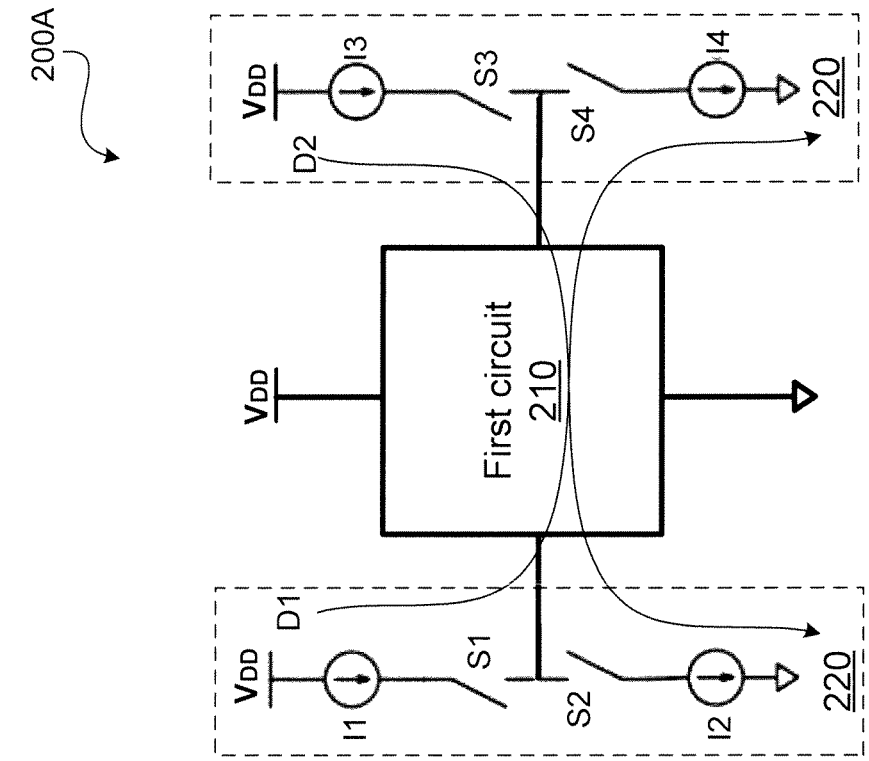
FIGS. 2A through 2E illustrate examples of an apparatus for driving a load using a low supply voltage in accordance with one or more implementations.
Figure 2B:
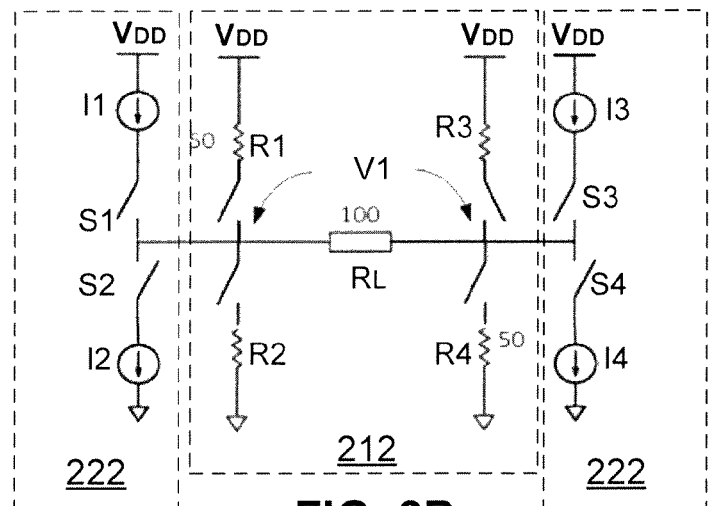

In one or more implementations, the first circuit 210 is implemented as the voltage-mode driver circuit 212 of FIG. 2B. The voltage-mode driver circuit 212 is similar to the voltage-mode driver circuit 100 of FIG. 1, and can be implemented to provide the desired termination impedance (e.g., through R1 and R4 or R3 and R2) that matches resistance of the load resistor RL (e.g., 100Ω) and a fixed output voltage. The deficiency of the voltage-mode driver circuit 212 in providing the desired current through the load resistor $R_L$ is alleviated by the current source arrangement 222, which is similar to the current source arrangement 220 of FIG. 2A described above.

Figure 2C:
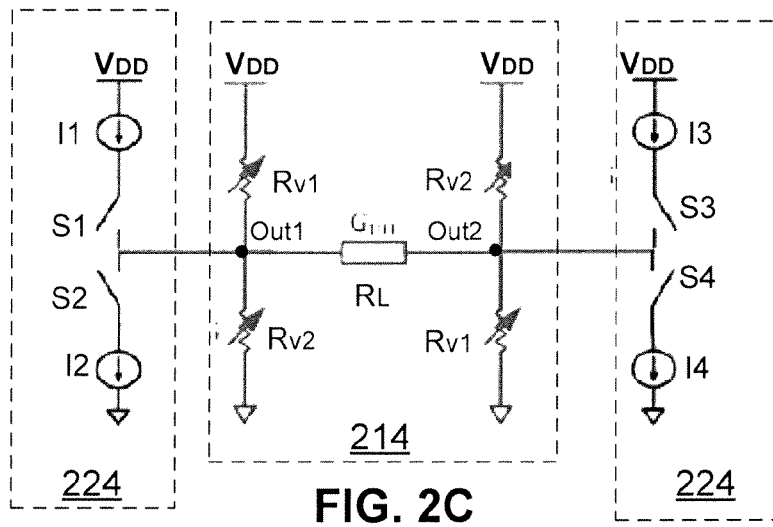

In some implementations, the first circuit 210 is realized as a constant-impedance voltage-mode driver circuit 214 of FIG. 2C. The constant-impedance voltage-mode driver circuit 214 includes variable resistors Rv1 and Rv2 that can be controlled independently to provide constant-impedance values (e.g., as viewed by a signal) between nodes Out1 and Out2 and the ground node, while allowing variation of the voltage amplitude (e.g., based on pre-emphasis) across the load resistor $R_L$. The constant-impedance voltage-mode driver circuit 214 can be implemented to provide the desired termination impedance, while the current source arrangement 224, which is similar to the current source arrangement 220 of FIG. 2A described above, provides the additional current through the load resistor $R_L$ that can establish the desired voltage swing across the load resistor $R_L$ (e.g., 100Ω).

Figure 2D:
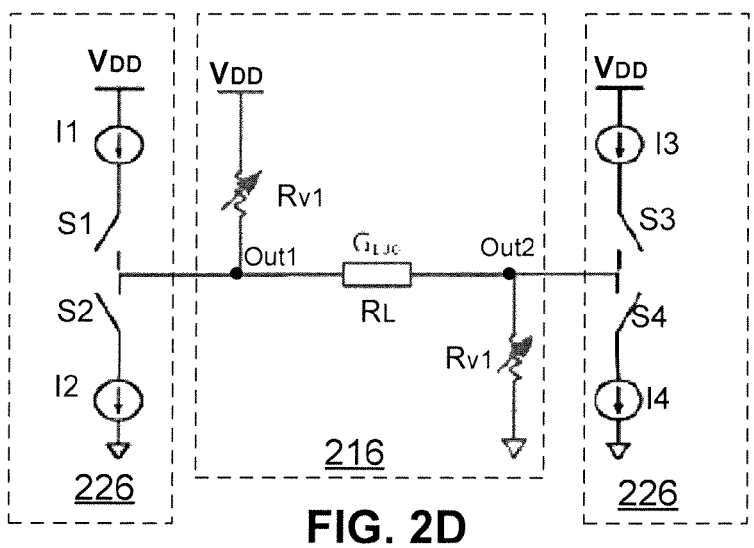

In some aspects, the first circuit 210 is implemented as a variable-impedance voltage-mode driver circuit 216 of FIG. 2D. The variable-impedance voltage-mode driver circuit 216 includes variable resistors Rv1 and provides variable impedance and voltage amplitude values between nodes Out1 and Out2 and the ground node. The current source arrangement 226 is similar to the current source arrangement 220 of FIG. 2A described above.

Figure 2E:
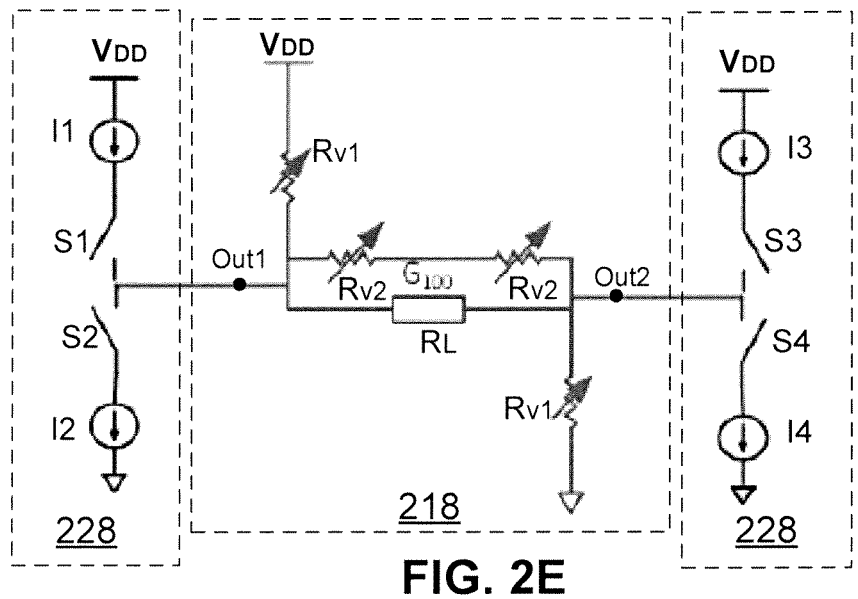

In one or more implementations, the first circuit 210 is realized as a constant-impedance voltage-mode driver circuit 218 with shunt elements, as shown in FIG. 2E. The shunt elements include the variable resistors Rv1 and Rv2 provide a constant impedance values at nodes Out1 and Out2, while allowing variation of the voltage amplitude (e.g., based on pre-emphasis) across the load resistor $R_L$. The constant-impedance voltage-mode driver circuit 218 is a lower power consumption implementation of the constant-impedance voltage-mode driver circuit 214 of FIG. 2C. The current source arrangement 228 is similar to the current source arrangement 220 of FIG. 2A described above.

Each of the above-described voltage-mode driver circuits (e.g., 210, 212, 214, 216, and 218) or the current source arrangement 220 are configurable to provide a desired termination impedance and output voltage amplitude control and/or equalization control, while maintaining a predetermined range of voltage swing (e.g., based on a standard) across the load resistor $R_L$. The desired termination impedance is determined based on a desired return loss and is typically within the range of 80-120Ω.

Figure 3A:
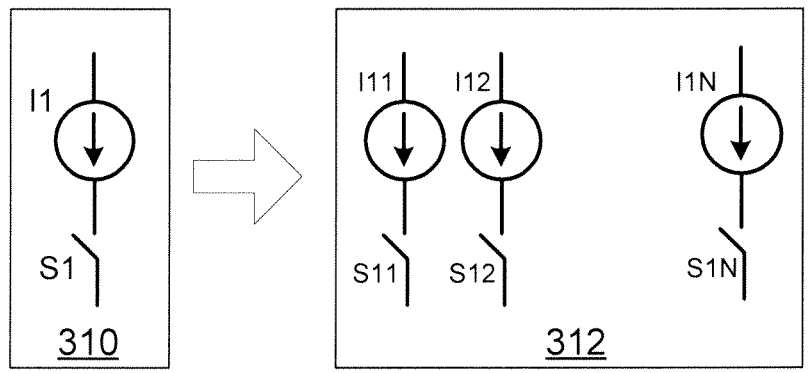
FIGS. 3A-3B illustrate examples of configurable current sources of an apparatus for driving a load using a low supply voltage in accordance with one or more implementations.
Figure 3B:
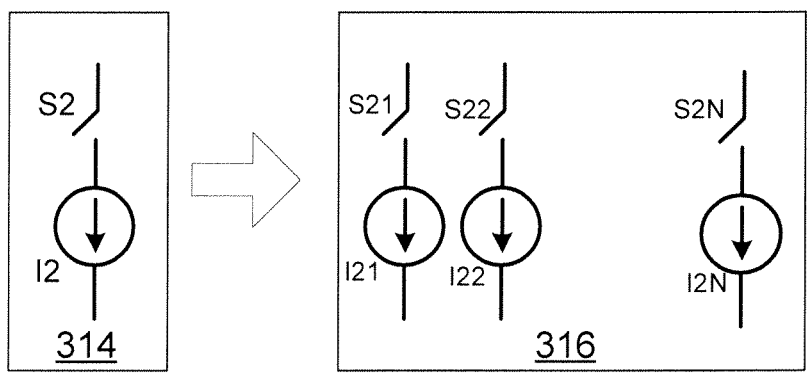

FIGS. 3A-3B illustrate examples of configurable current sources I1 and I2 of an apparatus for driving a load using a low supply voltage in accordance with one or more implementations of the subject technology. As shown in FIG. 3A, a branch 310 (e.g., an upper portion of the current source arrangement 220 of FIG. 2A) including the current source I1 and the switch S1 can be implemented by a parallel combination 312 of a number of branches including current sources I11 through I1N and switches S11 through S1N. The switches S11 through S1N can be dynamically controlled to drive desired current values to the load resistor (e.g., $R_L$ of FIG. 2B).

FIG. 3B shows a, a branch 314 (e.g., a lower portion of the current source arrangement 220 of FIG. 2A) including a switch S2 and the current source I2 can be realized by a parallel combination 316 of a number of branches including switches S21 through S2N and current sources I21 through I2N. The switches S21 through S2N can be dynamically controlled to drive desired current values to the load resistor (e.g., $R_L$ of FIG. 2B). For example, the configurable arrangements 312 and 316 allows for current sources I1 and I2 of any of the above-described current source arrangements (e.g., 220 of FIG. 2A) to have equal or different current values that can be dynamically controlled.

Figure 4:
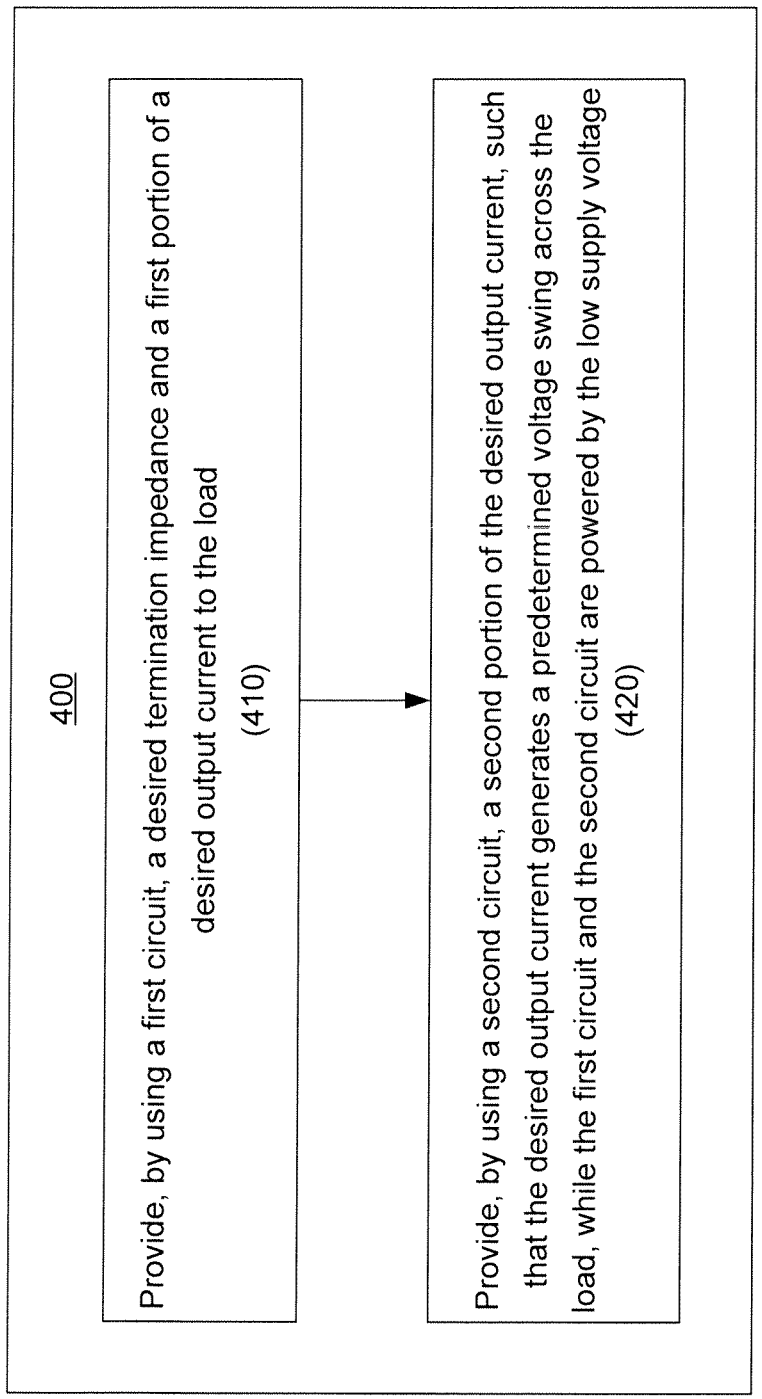
FIG. 4 illustrates an example of a method for driving a load using a low supply voltage in accordance with one or more implementations.

FIG. 4 illustrates an example of a method 400 for driving a load using a low supply voltage in accordance with one or more implementations of the subject technology. For explanatory purposes, the blocks of the example method 400 are described herein as occurring in serial, or linearly. However, multiple blocks of the example method 400 can occur in parallel. In addition, the blocks of the example method 400 need not be performed in the order shown and/or one or more of the blocks of the example method 400 need not be performed.

The method 400 includes providing, by using a first circuit (e.g., 210 of FIG. 2A), a desired termination impedance (e.g., R1+R4 or R3+R2 of FIG. 2B) and a first portion of a desired output current to the load (e.g., $R_L$ of FIG. 2A) (410). A second portion of the desired output current is provided, by using a second circuit (e.g., 220 of FIG. 2A), such that the desired output current generates a predetermined voltage swing across the load, while the first circuit and the second circuit are powered by the low supply voltage (e.g., $V_{DD}$ of FIG. 2A) (420).

Figure 5:
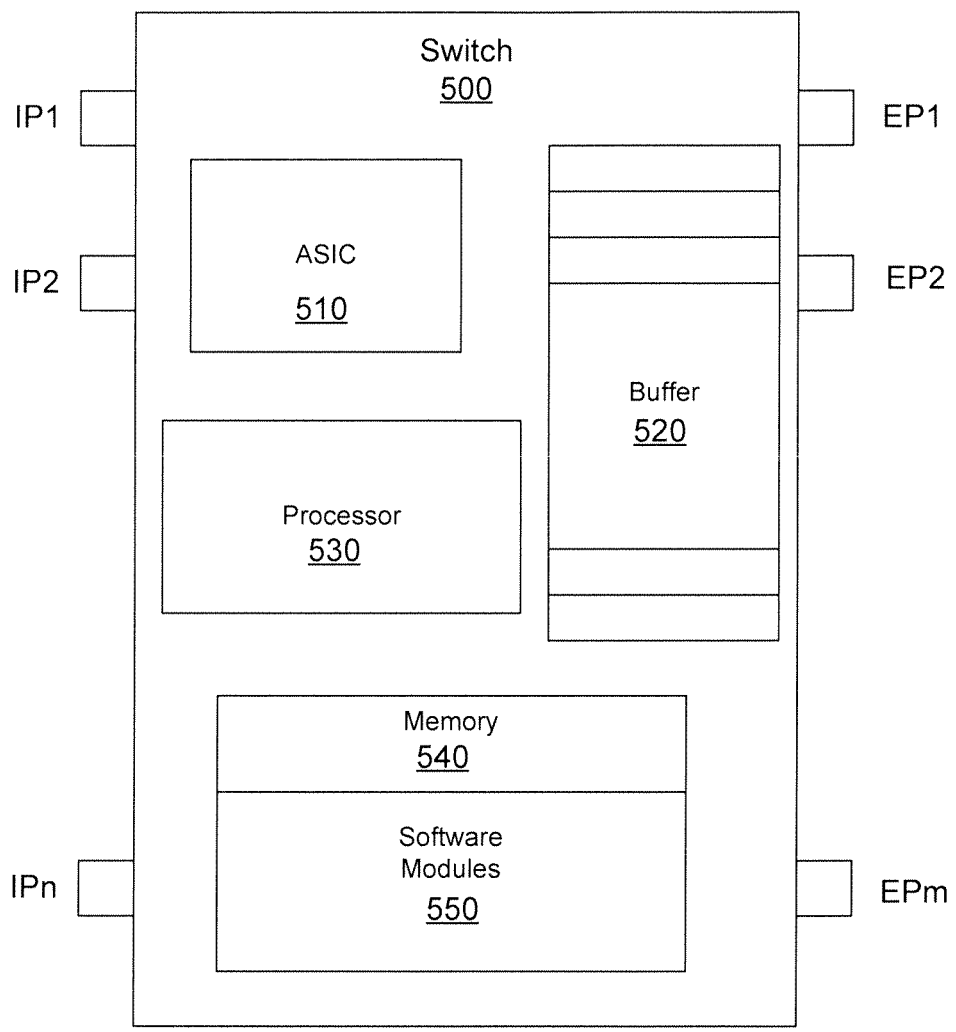
FIG. 5 illustrates an example of a communication device employing features of the subject technology for driving one more loads using a low supply voltage in accordance with one or more implementations.

FIG. 5 illustrates an example of a communication device 500 employing features of the subject technology for driving one more loads using a low supply voltage in accordance with one or more implementations. Examples of the communication device 500 includes an Ethernet switch of an Ethernet network such as a private network including a data-center network, an enterprise network, or other private networks. The communication device 500 includes a number of ingress (input) ports IP1-IPn and multiple egress (output) ports EP1-EPm. In one or more implementations, one or more of the ingress ports IP1-IPn can receive a data packet from another switch or and endpoint device of the network. The communication device 500 further includes a hardware component such as an application specific integrated circuit (ASIC) 510 (which in some embodiments can be implemented as a field-programmable logic array (FPGA)), a buffer 520, a processor 530, memory 540, and a software module 550.

In some implementations, the ASIC 510 can include suitable logic, circuitry, interfaces and/or code that can be operable to perform functionalities of a PHY circuit. The buffer 520 includes suitable logic, circuitry, code and/or interfaces that are operable to receive and store and/or delay a block of data for communication through one or more of the egress ports EP1-EPm. The processor 530 includes suitable logic, circuitry, and/or code that can enable processing data and/or controlling operations of the communication device 500. In this regard, the processor 530 can be enabled to provide control signals to various other portions of the communication device 500. The processor 530 also controls transfers of data between various portions of the communication device 500. Additionally, the processor 530 can enable implementation of an operating system or otherwise execute code to manage operations of the communication device 500.

The memory 540 includes suitable logic, circuitry, and/or code that can enable storage of various types of information such as received data, generated data, code, and/or configuration information. The memory 540 includes, for example, RAM, ROM, flash, and/or magnetic storage. In various embodiment of the subject technology, the memory 540 may include a RAM, DRAM, SRAM, T-RAM, Z-RAM, TTRAM, or any other storage media. The memory 540 can include software modules 550 that when executed by a processor (e.g., processor 530) can perform some or all of the functionalities of the ASIC 510. In some implementations, the software modules 550 include codes that when executed by a processor can perform functionalities such as configuration of the communication device 500.

In some implementations the communication device 500 may be implemented in a 28 nm or smaller technology node and be powered by a low voltage supply (e.g., 0.8V). In these implementations, various chips (e.g., the ASIC 510, the processor 530, and the memory 540) of the communication device 500 may be coupled to one another via lines that are driven by voltage-mode drivers of the subject technology such as the apparatuses shown in any of FIGS. 2A through 2E to provide acceptable voltage swings across input nodes of the chips. In some aspects, the communication device 500 includes one or more universal serial bus (USB) interfaces that can also be driven by the disclosed voltage-mode drivers and benefit from the advantages features of the subject technology such as low power consumption, reduced chip area, and without return loss.

Those of skill in the art would appreciate that the various illustrative blocks, modules, elements, components, and methods described herein can be implemented as electronic hardware, computer software, or combinations of both. To illustrate this interchangeability of hardware and software, various illustrative blocks, modules, elements, components, and methods have been described above generally in terms of their functionality. Whether such functionality is implemented as hardware or software depends upon the particular application and design constraints imposed on the overall system. Skilled artisans can implement the described functionality in varying ways for each particular application. Various components and blocks can be arranged differently (e.g., arranged in a different order, or partitioned in a different way) all without departing from the scope of the subject technology.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

A phrase such as "an aspect" does not imply that such aspect is essential to the subject technology or that such aspect applies to all configurations of the subject technology. A disclosure relating to an aspect can apply to all configurations, or one or more configurations. An aspect can provide one or more examples of the disclosure. A phrase such as an "aspect" refers to one or more aspects and vice versa. A phrase such as an "embodiment" does not imply that such embodiment is essential to the subject technology or that such embodiment applies to all configurations of the subject technology. A disclosure relating to an embodiment can apply to all embodiments, or one or more embodiments. An embodiment can provide one or more examples of the disclosure. A phrase such an "embodiment" can refer to one or more embodiments and vice versa. A phrase such as a "configuration" does not imply that such configuration is essential to the subject technology or that such configuration applies to all configurations of the subject technology. A disclosure relating to a configuration can apply to all configurations, or one or more configurations. A configuration can provide one or more examples of the disclosure. A phrase such as a "configuration" can refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein can be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. An apparatus for driving a load using a single supply voltage, the apparatus comprising:
    a voltage-mode driver formed of independently controllable variable resistors directly coupled to the single supply voltage and configurable to provide a desired termination impedance and a first portion of a desired output current to the load; and
    a current source arrangement comprising current sources configured to provide a second portion of the desired output current to the load and to generate a predetermined voltage swing across the load, and wherein the current source arrangement is powered by the single supply voltage and is configured to dynamically control an amount of current being provided to the load.

2. The apparatus of claim 1, wherein the voltage-mode driver comprises a constant-impedance voltage-mode driver.

3. The apparatus of claim 1, wherein the voltage-mode driver comprises a variable-impedance voltage-mode driver.

4. The apparatus of claim 1, wherein the voltage-mode driver comprises a constant-impedance voltage-mode driver including one or more shunt elements.

5. The apparatus of claim 1, wherein at least one of the voltage-mode driver or the current source arrangement is configurable to be used for at least one of an output voltage amplitude control or an equalization control, and wherein the predetermined voltage swing is determined based on a standard.

6. The apparatus of claim 1, wherein the current source arrangement comprises switches configurable to provide the second portion of the desired output current flowing in two opposing directions into the load.

7. The apparatus of claim 1, wherein the single supply voltage is a nominal supply voltage associated with a technology node, and wherein the nominal supply voltage is insufficient for enabling the voltage-mode driver to provide the desired output current to the load.

8. The apparatus of claim 1, wherein the desired termination impedance is determined based on a desired return loss.

9. A method for driving a load using a single supply voltage, the method comprising:
    providing, by using a first circuit formed of independently controllable variable resistors directly coupled to the single supply voltage, a desired termination impedance and a first portion of a desired output current to the load; and
    providing, by using a second circuit comprising current sources, a second portion of the desired output current, wherein the desired output current generates a predetermined voltage swing across the load, and wherein the second circuit is powered by the single supply voltage, and the current sources are configured to dynamically control an amount of current being provided to the load.

10. The method of claim 9, wherein providing the desired termination impedance and the first portion of the desired output current comprises using a voltage-mode driver, and wherein the voltage-mode driver comprises a constant-impedance voltage-mode driver.

11. The method of claim 9, wherein providing the desired termination impedance and the first portion of the desired output current comprises using a voltage-mode driver, and wherein the voltage-mode driver comprises a variable-impedance voltage-mode driver.

12. The method of claim 9, wherein providing the desired termination impedance and the first portion of the desired output current comprises using a voltage-mode driver, and wherein the voltage-mode driver comprises a constant-impedance voltage-mode driver including one or more shunt elements.

13. The method of claim 9, wherein providing the desired termination impedance and the first portion of the desired output current comprises using a voltage-mode driver, and wherein the method further comprises configuring at least one of the voltage-mode driver or the second circuit to be used for at least one of an output voltage amplitude control or an equalization control, and wherein the predetermined voltage swing is determined based on a standard.

14. The method of claim 9, wherein the method further comprises implementing the current source arrangement by using current sources and switches configurable to provide the remaining portion of the desired output current flowing in two opposing directions into the load.

15. The method of claim 9, wherein the single supply voltage is a nominal supply voltage associated with a technology node, and wherein the nominal supply voltage is insufficient for enabling the voltage-mode driver to provide the desired output current to the load.

16. The method of claim 9, further comprising determining the desired termination impedance based on a desired return loss.

17. A system comprising:
    a high-speed serializer deserializer (SerDes) device powered by a single supply; and
    a driver circuit configured to provide a desired swing across input nodes of the SerDes device,
    wherein the driver circuit comprises:
        a first circuit formed of independently controllable variable resistors and configured to provide a desired termination impedance and a first portion of a desired output current to the input nodes of the SerDes device; and
        a second circuit comprising current sources configured to provide a second portion of the desired output current, wherein the desired output current generates the desired voltage swing across the input nodes of the SerDes device, and wherein the first and the second circuits are powered by the single supply voltage, and the current sources are configured to dynamically control an amount of current being provided to the input nodes of the SerDes device.

18. The system of claim 17, wherein the first circuit comprises a voltage-mode driver, and wherein the voltage-mode driver comprises one of a constant-impedance voltage-mode driver, variable-impedance voltage-mode driver, or a constant-impedance voltage-mode driver including one or more shunt elements.

19. The system of claim 17, wherein the second circuit comprises a current source arrangement, wherein the current source arrangement comprises switches and is configurable to provide the second portion of the desired output current flowing in two opposing directions into the input nodes of the SerDes device.

20. The system of claim 17, wherein the single supply voltage is a nominal supply voltage associated with a technology node, and wherein the nominal supply voltage is insufficient for enabling the voltage-mode driver to provide the desired output current to the input nodes of the SerDes device.

* * * * *